(12) United States Patent
Perroni et al.

(10) Patent No.: US 8,982,612 B2
(45) Date of Patent: Mar. 17, 2015

(54) ROW DECODER CIRCUIT FOR A PHASE CHANGE NON-VOLATILE MEMORY DEVICE

(71) Applicant: STMicroelectronics S.r.l., Agrate Brianza (MB) (IT)

(72) Inventors: Maurizio Francesco Perroni, Furnari (IT); Guido Desandre, Brugherio (IT); Salvatore Polizzi, Palermo (IT); Giuseppe Castagna, Palermo (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 190 days.

(21) Appl. No.: 13/888,593

(22) Filed: May 7, 2013

(65) Prior Publication Data

US 2013/0301348 A1 Nov. 14, 2013

(30) Foreign Application Priority Data

May 8, 2012 (IT) .............................. TO2012A0412

(51) Int. Cl.
*G11C 11/00* (2006.01)
*G11C 13/00* (2006.01)
*G11C 8/10* (2006.01)

(52) U.S. Cl.
CPC .............. *G11C 13/0028* (2013.01); *G11C 8/10* (2013.01); *G11C 13/0004* (2013.01); *G11C 13/0069* (2013.01); *G11C 2213/79* (2013.01)
USPC ............................. 365/158; 365/163; 365/173

(58) Field of Classification Search
CPC .............. G11C 8/08; G11C 8/14; G11C 8/12; G11C 7/1048; G11C 7/18; G11C 2213/72; G11C 16/08; G11C 13/0023; G11C 17/18; G11C 2213/71; G11C 2213/76; G11C 13/0069; G11C 8/10

USPC .................................. 365/158, 163, 171–175
See application file for complete search history.

(56) References Cited

U.S. PATENT DOCUMENTS

| 5,371,705 | A | 12/1994 | Nakayama et al. | |
| 7,869,267 | B2 * | 1/2011 | Resta et al. | 365/158 |
| 7,940,555 | B2 * | 5/2011 | De Sandre | 365/163 |

FOREIGN PATENT DOCUMENTS

| EP | 2159800 | 3/2010 |
| WO | 2008082995 | 7/2008 |

OTHER PUBLICATIONS

Bedeschi et al., "4-Mb MOSFET selected μ trench phase-change memory experimental chip", IEEE Journal of Solid-State Circuits, vol. 40, No. 7, Jul. 2005, pp. 1557-1565.

*Primary Examiner* — Hien Nguyen
(74) *Attorney, Agent, or Firm* — Allen, Dyer, Doppelt, Milbrath & Gilchrist, P.A.

(57) ABSTRACT

A row decoder circuit for a phase change non-volatile memory device may include memory cells arranged in a wordlines. The device may be configured to receive a first supply voltage and a second supply voltage higher than the first supply voltage. The row decoder may include a global predecoding stage configured to receive address signals and generate high-voltage decoded address signals in a range of the second supply voltage and a biasing signal with a value based upon an operation. The row decoder may include a row decoder stage coupled to the global predecoding stage. The row decoder stage may include a selection driving unit configured to generate block-address signals based upon the high-voltage decoded address signals and a row-driving unit configured to generate a row-driving signal for biasing the wordlines based upon the block-address signals and the biasing signal.

26 Claims, 4 Drawing Sheets

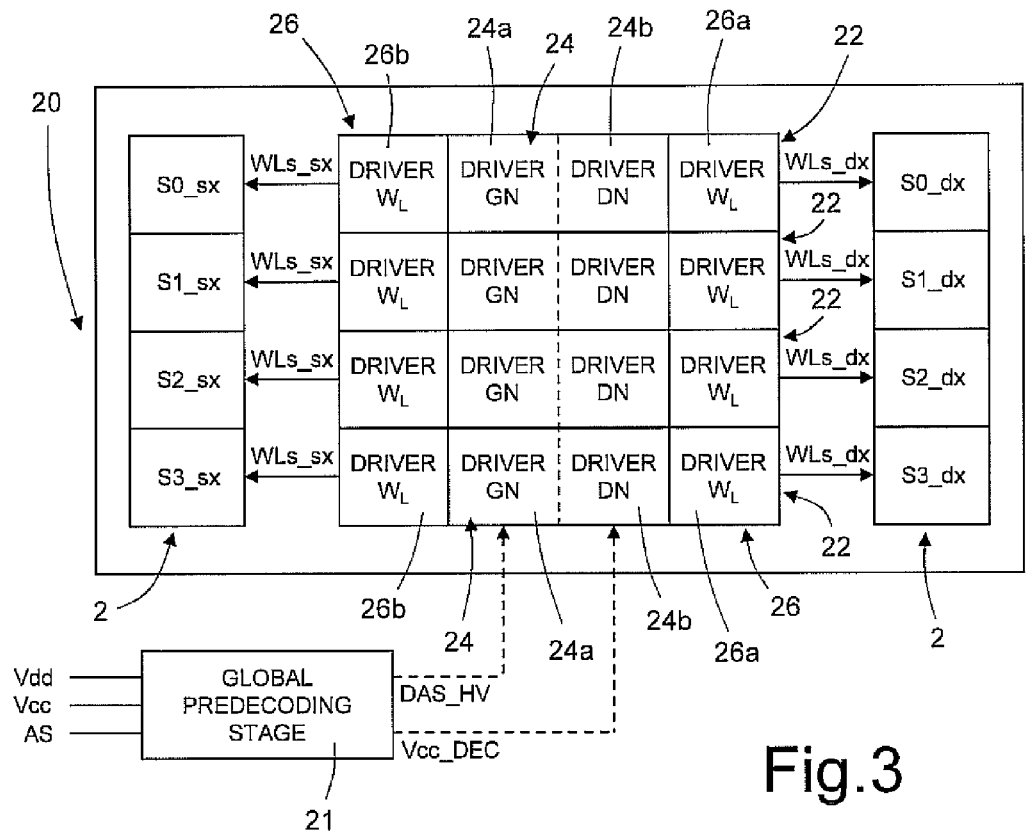
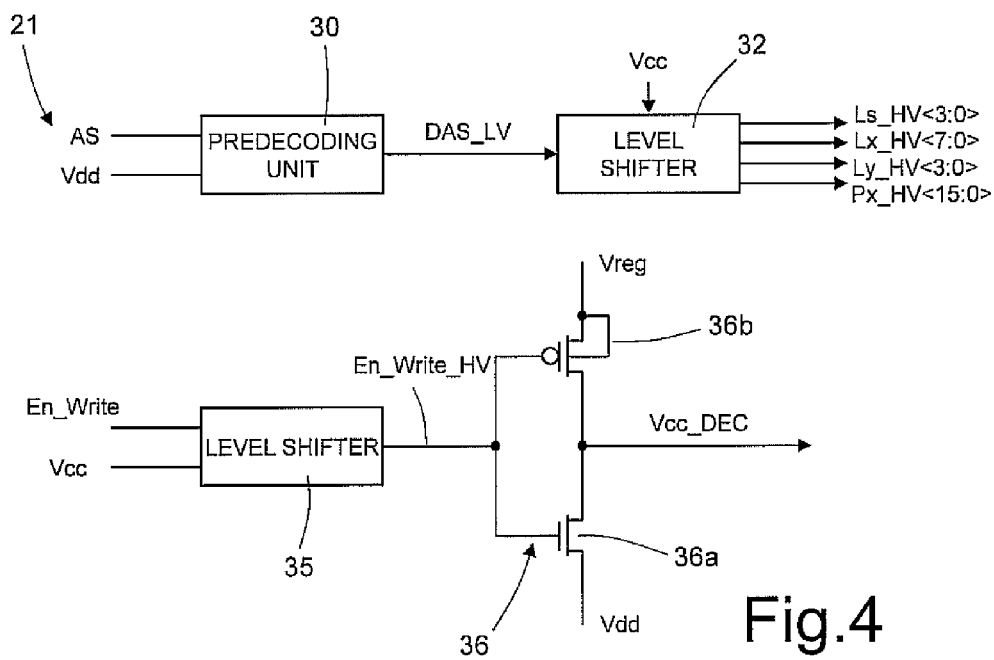
Fig.3
Fig.4

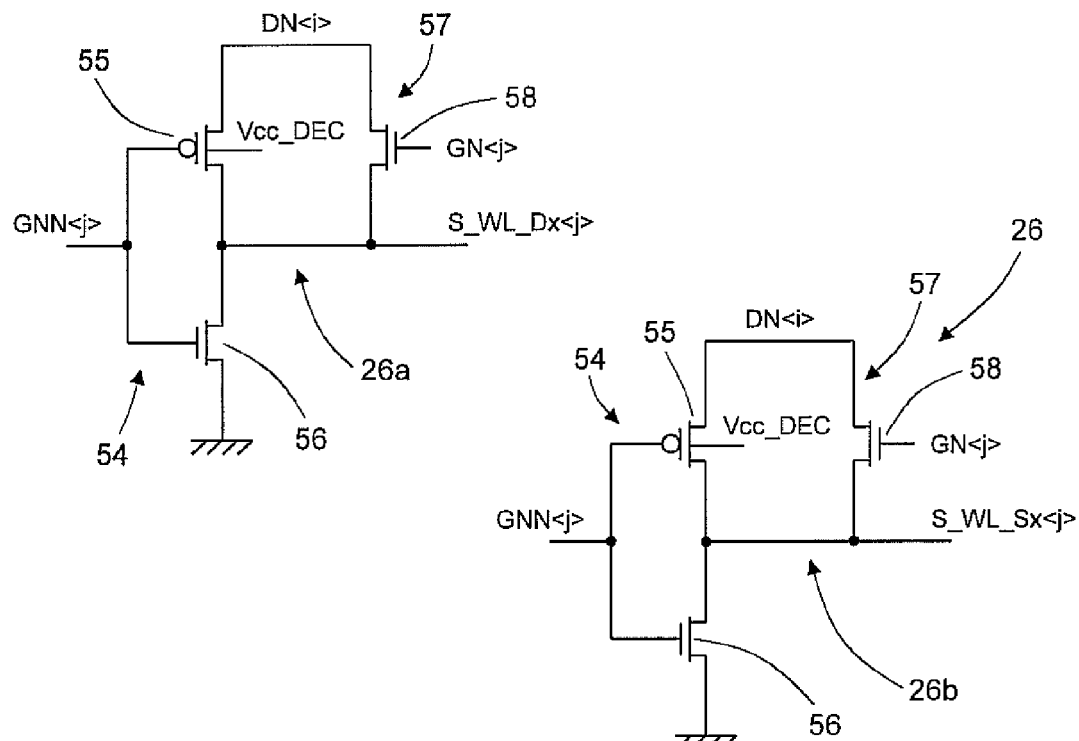
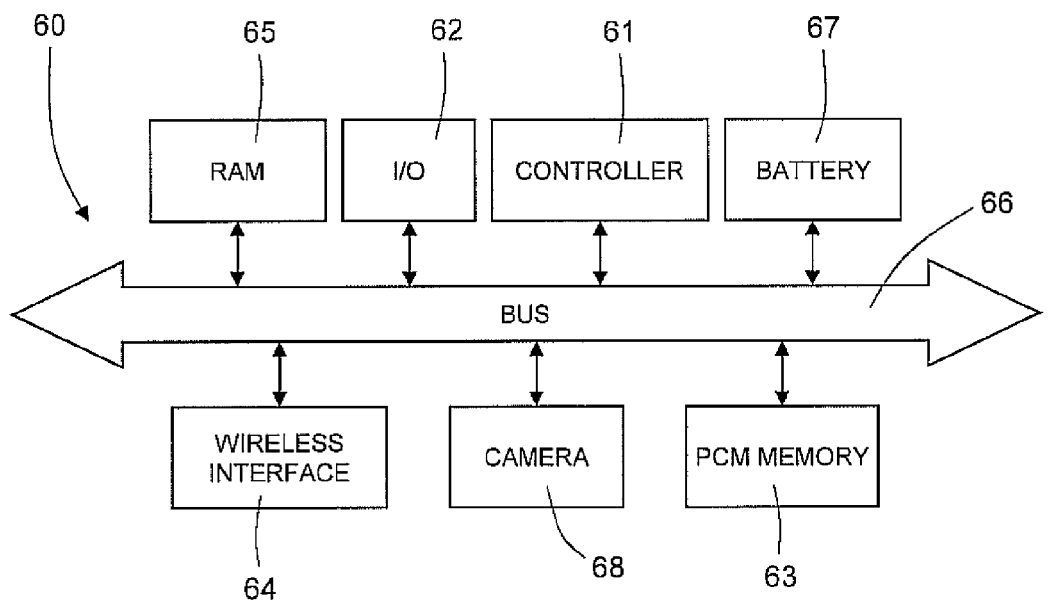
Fig.7
Fig.8

ROW DECODER CIRCUIT FOR A PHASE CHANGE NON-VOLATILE MEMORY DEVICE

FIELD OF THE INVENTION

The present invention relates to a row decoder circuit for a phase change non-volatile memory device for selection and biasing of rows of the corresponding memory array during reading and programming operations of the memory cells each time selected.

BACKGROUND OF THE INVENTION

Phase change non-volatile memories (ePCMs—embedded Phase Change Memories) may represent a new generation of integrated memories, in which the characteristics of materials having the property of switching between phases with different electrical characteristics are exploited for storing information. These materials may switch between a disorderly amorphous phase and an orderly crystalline or polycrystalline phase. Resistivities with considerably different values, and consequently, a different value of a data stored are associated with the two phases. For example, the elements of the sixth group of the periodic table, such as tellurium (Te), selenium (Se), or antimony (Sb), called chalcogenides or chalcogenic materials, may advantageously be used for phase change memory cells. In particular, an alloy made of germanium (Ge), antimony (Sb), and tellurium (Te), known as GST (having a chemical composition $Ge_2Sb_2Te_5$), is currently widely used in these memory cells.

Phase changes may be obtained by locally increasing the temperature of the cells of chalcogenic material, through resistive electrodes (generally known as heaters) set in contact with respective regions of chalcogenic material. Access devices (for example metal oxide field effect transistors (MOSFETs)), are connected to the heaters and enable selective flow of an electric programming current through a respective heater. This electric current, by the Joule effect, generates the temperatures for a phase change. In particular, when the chalcogenic material is in the amorphous state, with high resistivity (the "RESET" state), a current/voltage pulse (or an appropriate number of current/voltage pulses) of a duration and amplitude is applied to enable the chalcogenic material to cool slowly. Subjected to this treatment, the chalcogenic material changes its state and switches from the high-resistivity state to a low-resistivity state (the "SET" state). Instead, when the chalcogenic material is in the SET state, a current/voltage pulse of an appropriate duration and a high amplitude is applied to cause the chalcogenic material to return into the high-resistivity amorphous state.

During reading, the state of the chalcogenic material is detected by applying a voltage that is sufficiently low as not to cause a sensible heating thereof, and then by reading the value of the current that flows in the memory cell. Since the current is proportional to the conductivity of the chalcogenic material, it may be possible to determine in which state the material is found, and thus determine the data stored in the memory cell. In general, PCMs allow advantages, among which a high scalability and reading speed combined with a low current consumption and a high efficiency.

In a known manner, and as is shown schematically in FIG. 1, a non-volatile PCM device, designated by 1, generally comprises a memory array 2 made up of a plurality of memory cells 3, organized in rows (wordlines—WL) and columns (bitlines—BL). Each memory cell 3 includes a storage element 3a and an access element 3b connected in series between a respective bitline BL and a reference potential terminal (for example, ground, GND). In particular, a wordline WL is defined by the set of all the control terminals of the access elements 3b aligned along one and the same row.

The storage element 3a includes a phase change material (for example, a chalcogenide, such as GST), and is able to store data in the form of resistance levels associated with the various phases assumed by the material. The access element 3b, in the embodiment illustrated, is an N-channel complementary metal oxide semiconductor (CMOS) transistor having its gate terminal connected to a respective wordline WL, its drain terminal connected to the storage element 3a, and its source terminal connected to the reference potential terminal. The access element 3b is controlled and biased to enable, when selected, the flow of a reading/programming (modify) driving current through the storage element 3a, having an appropriate value during respective reading/programming operations.

A column decoder 4 and a row decoder 5 enable selection, based upon address signals received at the input (generated in a known manner and designated as a whole by AS) of the memory cells 3, and in particular of the corresponding wordlines WL and bitlines BL, each time addressed, enabling biasing thereof to appropriate voltage and current values. The column decoder 4 is moreover advantageously configured to define internally two distinct paths towards the bitlines BL of the memory array 2 each time selected: a reading path to selectively create a conductive path between the bitline BL selected and a sense-amplifier stage 7 to compare the current circulating in the addressed memory cell 3 with a reference current to determine the data stored; and a programming path to selectively create a conductive path between the bitline BL selected and a driving stage 8, which is configured to supply the high currents for generating the changes of state during the programming operations for the Set and Reset states.

In the specific case of PCMs, it is also known that the reading operations, as compared to the programming operations, use sensibly lower values for the biasing voltage applied to the wordlines to enable the desired current flow through the storage element 3a, especially when selector transistors of a MOS type are used (for example, a value of 1.2 V during reading and of 2.8 V during programming). In this regard, memory devices of a known type work with two internally available supply voltages: a first supply voltage Vdd, having a logic value, generally comprised between 1.08 V and 1.32 V, for example 1.2 V; and a second supply voltage Vcc, of a higher value, generally comprised between 3 V and 3.6 V. Inside the memory device, intermediate voltages are moreover generated, for example by level-shifter stages, that are for the programming operations of the memory cells.

As shown schematically in FIG. 2, the memory array 2 is generally organized in a plurality of sectors Sn (n being an integer index ranging from 1 to the total number of sectors), each of which comprises a plurality of memory cells 3. Each sector Sn has a plurality of respective local wordlines (in what follows referred to as sector wordlines WLs), which are distinct from those of the other sectors and are physically connected to the memory cells 3 present in the same sector Sn.

In a known embodiment, the row decoder 5 comprises a global row-predecoder stage 9, which receives at an input the first supply voltage Vdd (hence operating in the low-voltage range, i.e., with voltages not higher than the first supply voltage Vdd) and the address signals AS from an address bus. The global row-predecoder stage 9 generates, based upon the address signals AS, appropriate decoded address signals, which are also of a low-voltage type and are designated as a whole by DAS, common to all the sectors Sn of the memory array 2.

The row decoder 5 has a hierarchical architecture and comprises, for each sector Sn, two distinct circuit stages: a global row decoder stage 10, which receives the decoded address signals DAS and generates a first global wordline signal MWL for the reading operations and a second global wordline signal MWL_MV for the writing (programming/erasing) operations; and a local row decoder stage 12, which is operatively coupled to the global row decoder stage 10 and receives the global wordline signals MWL and MWL_MV and drives in an appropriate way, based upon the signals received at input, the sector wordlines WLs. For this purpose, the local row decoder 12 comprises a plurality of row drivers, not illustrated in FIG. 2, each supplying appropriate biasing signals to respective sector wordlines WLs to implement addressing of the corresponding memory cells.

As described in detail in patent application No. EP-A-2,159,800, having a common assignee with the present application, in a known embodiment, suitable level shifters, not shown in FIG. 2, are present within the global row decoder 10 for raising the voltage of the decoded address signals DAS based upon a regulated voltage Vreg for the programming operations (for example, equal to 2.3 V or 2.8 V, in the case of programming of the Set state and of the Reset state, respectively), and in particular for generation of the second global wordline signal MWL_MV.

The local row decoder 12 creates two distinct paths for biasing the sector wordlines WLs: a first path, selected during the reading operations by the first global wordline signal MWL and operating in the low-voltage range; and a second path, selected during the programming operations by the second global wordline signal MWL_MV and operating in the medium-voltage range (i.e., with voltages of a value comprised between the first supply voltage Vdd and the second supply voltage Vcc).

This row decoder architecture has the advantage, as compared to other known approaches (corresponding to different types of memory devices, for example of a flash type), of taking into account the specific characteristics of the PCMB, in particular with regard to the various voltage levels used in the reading and programming operations. In fact, this row decoder architecture envisages two distinct paths, each optimized for the reading and, respectively, the writing operations. For example, the reading path may advantageously comprise only low-voltage transistors (i.e., ones able to withstand operating voltages that are generally not higher than the first supply voltage Vdd), having a reduced thickness of the gate oxides and a small area occupation. However, the same row decoder architecture is relatively highly complex due to the presence of different hierarchical decoding levels and the different decoding paths in reading and programming, which may entail a corresponding large area occupation (notwithstanding the use of low-voltage transistors for decoding during the reading operations).

SUMMARY OF THE INVENTION

The present embodiments address, at least in part, the problems highlighted previously and may provide a row decoder architecture that may be particularly for the specific characteristics of PCMs.

According to an embodiment, a row decoder circuit is provided for a phase change non-volatile memory device. The memory device may include a plurality of memory cells arranged in a plurality of wordlines. The non-volatile memory device may be configured to receive a first supply voltage and a second supply voltage higher than the first supply voltage. The row decoder may include a global pre-decoding stage configured to receive address signals, and generate high-voltage decoded address signals in a range of the second supply voltage and a biasing signal with a value based upon an operation to be carried out. The row decoder may also include at least one row decoder stage coupled to the global predecoding stage and may include a selection driving unit configured to generate block-address signals based upon the high-voltage decoded address signals, and a row-driving unit configured to generate a row-driving signal for biasing at least one of the plurality of wordlines based upon the block-address signals and the biasing signal.

The global predecoding stage may include a multiplexer having a first input configured to receive the first supply voltage, a second input configured to receive a programming voltage having a value based upon a programming operation and between the first supply voltage and the second supply voltage, and an output configured to alternatively supply the first supply voltage and the programming voltage as the biasing signal based upon a control signal. The selection driving unit may include a first driver configured to generate first block-address signals and a second driver configured to generate second block-address signals. The row-driving unit may include a first pull-up PMOS transistor and a pull-down NMOS transistor each having a gate terminal connected together and configured to receive at an input a negated version of a respective first block-address signal that is negated, and each having a drain terminal connected together and supplying a respective row-driving signal.

The pull-up PMOS transistor may have a source terminal receiving a respective second block-address signal, and the pull-down NMOS transistor may have a source terminal connected to a reference potential. The row-driving unit may further include a pull-up NMOS transistor having a gate terminal receiving the respective first block-address signal, and may have drain and source terminals connected to the respective drain and source terminals of the pull-up PMOS transistor.

The first driver may be supplied by the second supply voltage during reading operations and during programming operations. The first driver may include an AND logic unit configured to receive at an input a first set of the high-voltage decoded address signals and to provide at an output the first block-address signals, and a first inverter unit configured to receive the first block-address signals and supply the negated version of the first block-address signals.

The second driver may include an input block configured to be supplied by the second supply voltage and configured to provide control signals. The second driver may also include an output block configured to be supplied by the biasing signal having alternatively a value of the first supply voltage and a value of a programming voltage based upon a programming operation and between the first supply voltage and the second supply voltage.

The input block may include an AND logic unit configured to receive at an input a second set of the high-voltage decoded address signals and to provide at an output the control signals. The input block may also include a second inverter unit configured to receive the control signals and supply a negated version of the control signals.

The output block of the second driver may include a respective first pull-up PMOS transistor and a respective pull-down NMOS transistor each having a gate terminal connected together and configured to receive at an input a negated version of a respective one of the control signals and each having a drain terminal connected together and configured to provide a respective second block-address signal. The respective first pull-up PMOS transistor may have a source terminal configured to receive the biasing signal, and the respective first pull-down NMOS transistor may have a source terminal connected to a reference potential. The output block may also include a respective pull-up NMOS transistor having a gate terminal configured to receive the respective one of the control signals and having drain and source terminals connected to the respective drain and source terminals of the respective pull-up PMOS transistor.

The memory cells may be arranged in sectors. Each sector may include a plurality of sector wordlines, and the at least one row decoder stage may include a plurality thereof associated with each of the sectors and configured to bias respective ones of the plurality of sector wordlines. The high-voltage decoded address signals and the biasing signal may be common for the plurality of row decoder stages of the sectors.

The global predecoding stage may include a predecoding unit configured to operate in a range of the first supply voltage and generate, based upon the address signals, low-voltage decoded address signals. The global predecoding stage may also include a level-shifter unit configured to receive second supply voltage and the low-voltage decoded address signals and to generate, by up level shifting, the high-voltage decoded address signals. The high-voltage decoded address signals may be common for the plurality of row decoder stages.

A method aspect is directed to a method of using a row decoder circuit for a phase change non-volatile memory device that includes a plurality of memory cells arranged in a plurality of wordlines. The phase change non-volatile memory device may be configured to receive a first supply voltage and a second supply voltage higher than the first supply voltage. The method may include using a global pre-decoding stage to receive address signals, and generate high-voltage decoded address signals in a range of the second supply voltage and a biasing signal with a value based upon an operation to be carried out. The method may also include using at least one row decoder stage coupled to the global predecoding stage. Using the at least one row decoder stage may include using a selection driving unit to generate block-address signals based upon the high-voltage decoded address signals, and using a row-driving unit to generate a row-driving signal for biasing at least one of the plurality of wordlines based upon the block-address signals and the biasing signal.

BRIEF DESCRIPTION OF THE DRAWINGS

FIG. 3 is a block diagram of a row decoder circuit for a non-volatile PCM device according to an embodiment of the present invention.

FIGS. 4-7 are schematic diagrams of circuit stages of the decoding circuit of FIG. 3.

FIG. 8 is a block diagram of an electronic system incorporating the non-volatile PCM device according to an embodiment of the present invention.

DETAILED DESCRIPTION OF THE PREFERRED EMBODIMENTS

Figure 1:
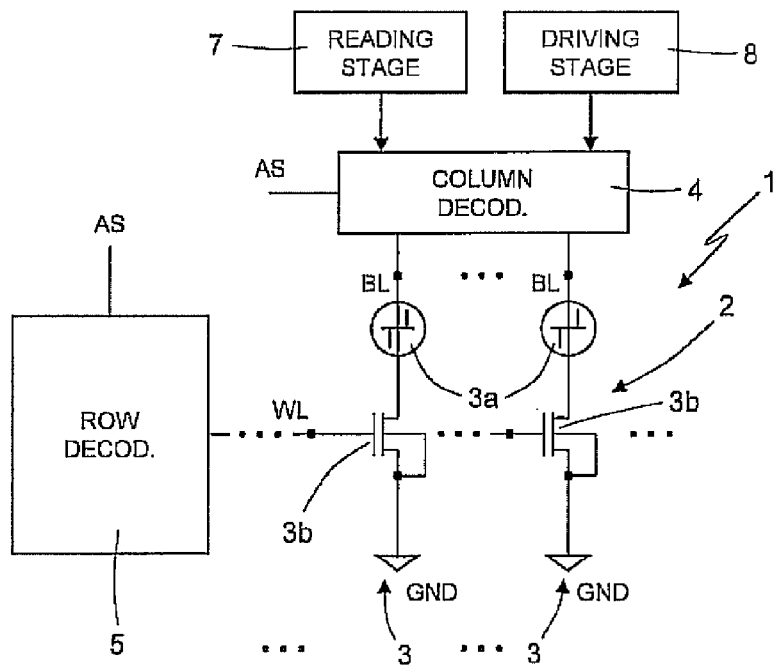
FIG. 1 is a block diagram of a non-volatile PCM device according to the prior art.

FIG. 3 shows a row decoder circuit 20 for a PCM device, according to one embodiment. In a known way, and in a way similar to what has been described previously, the PCM device has two supply voltages: a first supply voltage Vdd, having a logic value, for example comprised between 1.08 V and 1.32 V; and a second supply voltage Vcc, having a higher value, for example comprised between 3 V and 3.6 V.

Again in a way similar to what has been previously discussed, the memory device comprises a memory array, once again designated by 2, divided into sectors Sn (four in number in the non-limiting example shown in FIG. 3). In particular, in a known manner, to reduce the length of the sector wordlines WLs and increase the access speed to the memory, each sector Sn is divided into two half-sectors, referred to as right-hand half-sector Sn_dx and left-hand half-sector Sn_sx, each having the same number of sector wordlines WLs_dx, WLs_sx.

The row decoder circuit 20 comprises a global row-predecoder stage, here designated by 21, which receives at input the first and second supply voltages Vdd, Vcc and address signals AS from an address bus. These address signals AS are generated in a known way in the memory device, for selection of the rows and columns corresponding to the memory cells on which it is desired to carry out a reading or programming operation.

The global row-predecoder stage 21 generates, based upon the address signals AS, appropriate decoded address signals of a high-voltage type, designated as a whole by DAS_HV, common to all the sectors Sn of the memory array 2. The high-voltage decoded address signals DAS_HV comprise in particular, as is shown in FIG. 4: a first set of decoded address signals, designated by Ls_HV, for example including four signals (Ls_HV<3:0>) in the case where each half-sector Sn_dx, Sn_sx has a number of sector wordlines WLs equal to 512; a second set of decoded address signals, designated by Lx_HV, for example including eight signals (Lx_HV<7:0>) in the aforesaid case; a third set of decoded address signals, designated by Ly_HV, for example including four signals (Ly_HV<3:0>); and a fourth set of decoded address signals, designated by Px_HV, for example including sixteen signals (Px_HV<15:0>), in the case indicated.

In particular, and as will be described in detail hereinafter, the high-voltage decoded address signals DAS_HV are hence shifted to high voltages, for example, up to values corresponding to the second supply voltage Vcc, before reaching the sectors Sn of the memory array 2. The global row-predecoder stage 21 moreover generates, once again as will be described in detail hereinafter, a biasing signal Vcc_DEC, which is also generated at a global level (i.e., before reaching the sectors Sn of the memory array 2), and is supplied to the same sectors Sn.

The row decoder circuit 20 comprises, for each sector Sn, a row decoder stage 22, including a selection driving unit 24, which receives at input the high-voltage decoded address signals DAS_HV and includes a first driver 24a, which generates, as described in detail hereinafter, first block-address signals GN (for example, thirty-two in number, GN<31:0>, in the previous case where each sector Sn has a number of sector wordlines WLs equal to 512), and a second driver 24b, which generates second block-address signals ON (for example, sixteen in number, DN<15:0>). The row decoder circuit 20 also includes and a row-driving unit 26, which receives the first and second block-address signals GN, DN and generates, as described in detail hereinafter, row-driving signals S_WL for respective sector wordlines WLs.

In particular, in the embodiment illustrated, the row-driving unit 26 comprises two sub-units, 26a and 26b in a mirror configuration, to drive respective sector wordlines WLs_dx, WLs_sx of the right-hand half-sector Sn_dx and left-hand half-sector Sn_sx, respectively, of the memory array 2. The selection driving unit 24 is common for both of the sub-units 26a, 26b of the row-driving unit 26.

In greater detail, and as shown in FIG. 4, the global row-predecoder stage 21 comprises a predecoding unit 30 operating in the low-voltage range (i.e., with voltages with a maximum value equal to the first supply voltage Vdd), which receives the first supply voltage Vdd and the address signals AS and generates, in a known manner, low-voltage decoded address signals, designated as a whole by DAS_LV. The global row-predecoder stage 21 also includes a first level-shifter unit 32, which receives the second supply voltage Vcc and the low-voltage decoded address signals DAS_LV, and generates, by an up level shifting, the high-voltage decoded address signals DAS_HV, and in particular the signals Ls_HV, Lx_HV, Ly_HV and Px_HV.

The global row-predecoder stage 21 further comprises a second level-shifter unit 35, which receives a write-enable signal EN_Write generated in a known manner in the memory device and a value of which (for example, the high value) indicates a programming operating condition, and also receives the second supply voltage Vcc and generates, at its output, a version shifted upwards of the same write-enable signal, EN_Write_HV. The global row-predecoder stage 21 also includes a multiplexer unit 36, which receives at its input the first supply voltage Vdd and the regulated voltage Vreg for the programming operations (for example equal to 2.3 V or 2.8 V, in the case of programming of the Set state and of the Reset state, respectively), and supplies at its output, as a function of the shifted write-enable signal EN_Write_HV, alternatively the first supply voltage Vdd or the regulated voltage Vreg, as the biasing signal Vcc_DEC (the multiplexer unit 36 hence has two inputs, one output, and a control signal).

In greater detail, the multiplexer unit 36 comprises an NMOS transistor 36a, having its control terminal receiving the shifted write-enable signal EN_Write_HV, a first conduction terminal receiving the first supply voltage Vdd, and a second conduction terminal connected to the output of the multiplexer unit 36 on which the biasing signal Vcc_DEC is supplied. The multiplexer unit 36 also comprises a PMOS transistor 36b, having its control terminal receiving the shifted write-enable signal EN_Write_HV, a first conduction terminal receiving the regulated voltage Vreg, and a second conduction terminal connected to the output of the multiplexer unit 36.

Figure 5:
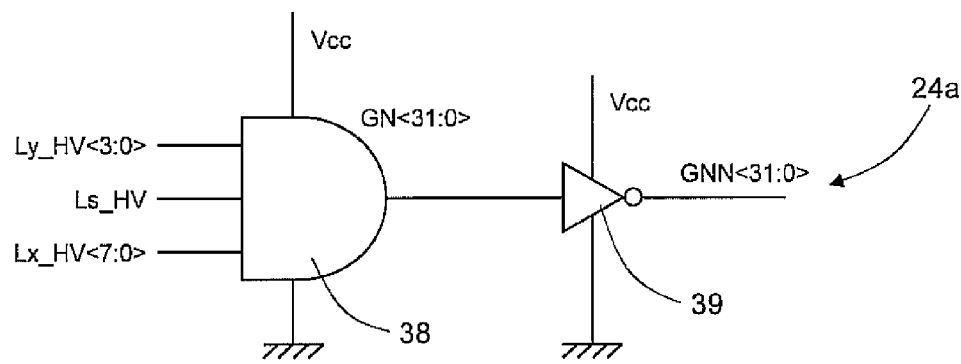
Figure 6:
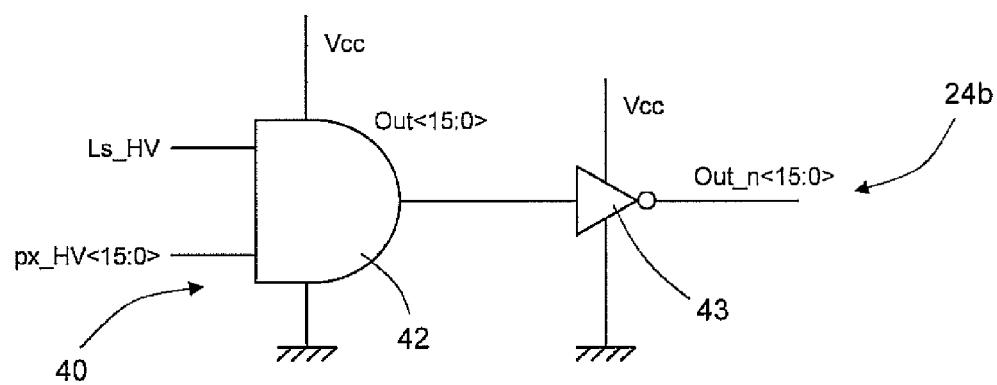
Figure 6:
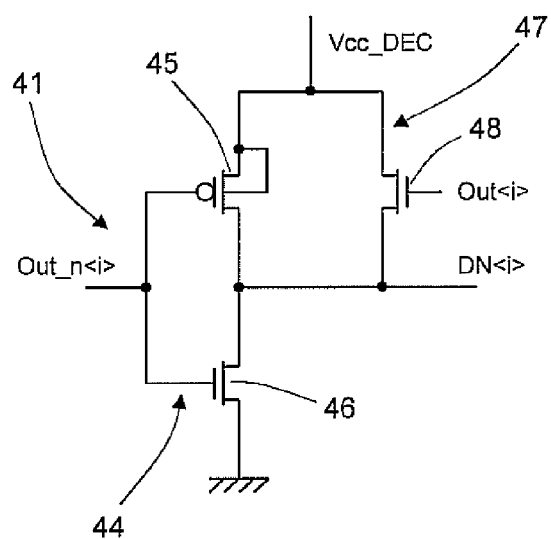

FIGS. 5 and 6 illustrate, respectively, the first driver 24a, configured to generate the first block-address signals GN, and the second driver 24b, configured to generate the second block-address signals DN, of the selection driving unit 24 of the row decoder stage 22.

In detail, the first driver 24a, entirely supplied by the second supply voltage Vcc, comprises an AND logic unit 38, which receives at its input the decoded address signals Lx_HV, Ly_HV and Ls_HV, and supplies at its output the first block-address signals GN. The first driver 24a also comprises a first inverter unit 39, which receives the first block-address signals GN and supplies a negated version thereof, designated by GNN. In the example illustrated, the first block-address signals GN, and their negated version GNN, are thirty-two in number (GN<31:0>, GNN<31:0>).

The second driver 24b comprises an input block 40, supplied by the second supply voltage Vcc, and an output block 41, supplied by the biasing signal Vcc_DEC. In this regard, the differentiation of the supply voltages for the first and second drivers 24a, 24b advantageously enables transfer with a low impedance of all the voltages used, for example even low voltages such as the first supply voltage Vdd (which may even reach a value of 1.08 V).

The input block 40 comprises an AND logic unit 42, which receives at its input the decoded address signals Px_HV and Ls_HV, and supplies at its output control signals Out (in the example sixteen in number, OUT<15:0>). The input block 40 also comprises a second inverter unit 43, which receives the control signals Out and supplies a negated version thereof, designated by Out_n.

The output block 41 comprises, for each of the control signals Out<i> (where i is an integer index ranging from 0 to the total number of control signals Out, in the example sixteen) an inverter 44, which is formed by a pull-up PMOS transistor 45 and a pull-down NMOS transistor 46, which have their gate terminals connected together and receiving at input the respective negated control signal Out_n<i>, and their drain terminals connected together and supplying a respective second block-address signal DN<i>. The pull-up PMOS transistor 45 has moreover its source terminal that receives the biasing signal Vcc_DEC, while the source terminal of the pull-down NMOS transistor 46 is connected to ground GND. The output block 41 further comprises a CMOS switch 47, formed by the aforesaid pull-up PMOS transistor 45 and by an NMOS transistor 48, having its gate terminal that receives the control signal Out<i>, and its drain and source terminals connected to the respective drain and source terminals of the pull-up PMOS transistor 45.

In use, according to the value of the control signals Out<i> generated by the input block 40, the output block 41 hence generates the appropriate values of the second block-address signals DN<i>, biasing them, when selected, to the value of the biasing signal Vcc_DEC. In general, the structure of the output block 41 with three MOS transistors enables use of the biasing signal Vcc_DEC as a configuration signal, with the decoding of the address signals that is entrusted to logic gates present upstream in the row decoder circuit 20.

With reference now to FIG. 7, the row-driving unit 26 comprises, for each of the first block signals GN<j> (where j is an integer index ranging from 0 to the total number of the first block signals GN, in the example thirty-two) an inverter 54, formed by a pull-up PMOS transistor 55 and a pull-down NMOS transistor 56, having their gate terminals connected together and receiving at input a respective first negated block signal GNN<j>, and their drain terminals connected together and supplying a respective row-driving signal S_WL<j>, designed to drive a sector wordline WLs according to a block-address decoding scheme. The pull-up PMOS transistor 55 moreover has its source terminal receiving a respective one of the second block-address signals DN<i> and its bulk terminal receiving the biasing signal Vcc_DEC. The source terminal of the pull-down NMOS transistor 56 is connected to ground GND. The row-driving unit 26 further comprises a CMOS switch 57, formed by the aforesaid pull-up PMOS transistor 55 and by an NMOS transistor 58, which has its gate terminal receiving the respective first block signal GN<j>, and its drain and source terminals connected to the respective drain and source terminals of the pull-up PMOS transistor 55. In particular, in the embodiment illustrated in FIG. 7, the two sub-units 26a and 26b driving the respective sector wordlines WLs_dx, WLs_sx of the right-hand half-sector Sn_dx and left-hand half-sector Sn_sx, respectively, receive the same first block-address signals GN<j> and second block-address signals DN<i>.

During operation, according to the value of the first block signals GN<j>, the row-driving unit 26 hence generates the appropriate biasing values for the respective sector wordlines WLs, biasing them, when selected, to the value defined by the second block-address signals DN<i> (which in turn is a function of the biasing signal Vcc_DEC). In particular, the MOS transistors in the row decoder circuit 20 are of a medium-voltage type, i.e., able to withstand voltages with values up to the second supply voltage Vcc. In one embodiment, these transistors are made with 90-nm CMOS technology.

FIG. 8 shows a portion of an electronic system 60 according to an embodiment. The electronic system 60 may be used in electronic devices, such as, for example, a personal digital assistant (PDA), a portable or fixed computer, possibly with capacity of wireless data transfer, a cellphone, a digital audio player, a photographic camera or a video camera, or further devices able to process, store, transmit, and receive information.

In detail, the electronic system 60 comprises a controller 61 (for example, provided with a microprocessor, a DSP, or a microcontroller) and an input/output device 62 (for example, provided with a keyboard and a display), for input and display of data. The electronic system 60 also comprises the non-volatile PCM device, here designated by 63, provided with the array of memory cells 3 of the phase change type, described previously and a wireless interface 64, for example an antenna, for transmitting and receiving data through a radio-frequency wireless communication network. The electronic system 60 also comprises a RAM 65. The above-noted components are coupled through a bus 66. A battery 67 may be used as power supply source in the electronic system 60, which may also be provided with a photographic or video camera 68.

The advantages of the row decoder circuit may be clear from the above description. In any case, it is once again emphasized that the proposed approach may simplify considerably the row decoder architecture for a non-volatile PCM device, enabling a saving of area occupation during integration, and maintaining the electrical performance unaltered, in particular, the access times, and in general the writing and reading operations.

Figure 2:
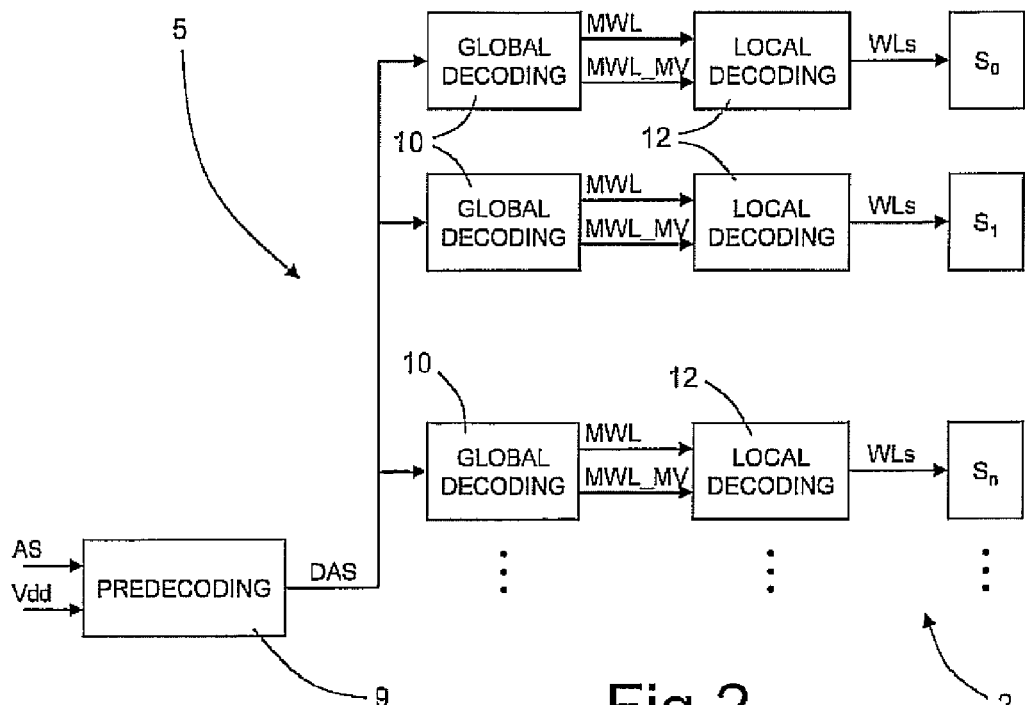
FIG. 2 is a block diagram of a row decoder in the memory device of FIG. 1 according to the prior art.

In particular, a considerable advantage in terms of area occupation is offered by the displacing at a global level (i.e., outside the individual sectors Sn, in a centralized position with respect to groups of the same sectors) the level shifters dedicated to the row predecoder, which generate the high-voltage decoded address signals DAS_HV. Moreover, the reduced number of transistors used is such that the use of medium-voltage transistors (having greater oxide thicknesses as compared to low-voltage transistors) may not entail an increase of area as compared to known approaches (such as, for example, the one described in FIG. 2). The decoding speed may not be penalized by the new architecture, based upon the use of the second supply voltage Vcc for the generation of the first block-address signals GN in the first driver 24a, and in part for generation of the second block-address signals DN in the input block 40 of the second driver 24b.

It is moreover advantageous to use just three operating voltages for the reading and programming operations, Vdd, Vcc, Vreg, namely just three lines for supplying the drivers in the row decoder circuit 20. In general, the advantages highlighted previously render the use of non-volatile PCM devices more competitive in terms of performance levels and manufacturing and operating costs.

Finally, modifications and variations may be made to what has been described and illustrated herein, without thereby departing from the scope of the present invention, as defined in the annexed claims. In particular, it may be evident that the architecture of the row decoder circuit may vary as compared to the embodiment illustrated, for example, the row decoder circuit may not be divided into right-hand and left-hand half-sectors, or a different number of sectors and/or of sector wordlines, and consequently a different number of first and second block-address signals may be used.

Furthermore, in general, the phase change non-volatile memory device incorporating the row decoder circuit described may have a wide range of uses, among which, for example, in microcontrollers, in applications where increased safety is desired and that use smart cards with a contact interface (such as PAYTV systems, SIM, TPM modules), for example, which has to meet the ETSI consumption specifications, and in contactless smart-card applications (RFIDs, NFCs, bank credit cards, etc.), where the memory module has a current budget limited by the "energy harvesting" system (i.e., the system for recovery of energy from the carrier) for all the operations (both writing and reading operations).

That which is claimed is:

1. A row decoder circuit for a phase change non-volatile memory device comprising a plurality of memory cells arranged in a plurality of wordlines, the phase change non-volatile memory device configured to receive a first supply voltage and a second supply voltage higher than the first supply voltage, the row decoder comprising:
a global predecoding stage configured to
receive address signals, and
generate high-voltage decoded address signals in a range of the second supply voltage and a biasing signal with a value based upon an operation to be carried out; and
at least one row decoder stage coupled to the global predecoding stage and comprising
a selection driving unit configured to generate block-address signals based upon the high-voltage decoded address signals, and
a row-driving unit configured to generate a row-driving signal for biasing at least one of the plurality of wordlines based upon the block-address signals and the biasing signal.

2. The circuit according to claim 1, wherein said global predecoding stage comprises a multiplexer having a first input configured to receive the first supply voltage, a second input configured to receive a programming voltage having a value based upon a programming operation and between the first supply voltage and the second supply voltage, and an output configured to alternatively supply the first supply voltage and the programming voltage as the biasing signal based upon a control signal.

3. The circuit according to claim 1, wherein said selection driving unit comprises a first driver configured to generate first block-address signals and a second driver configured to generate second block-address signals; wherein said row-driving unit comprises a first pull-up PMOS transistor and a pull-down NMOS transistor each having a gate terminal connected together and configured to receive at an input a negated version of a respective first block-address signal that is negated, and each having a drain terminal connected together and supplying a respective row-driving signal, said pull-up PMOS transistor having a source terminal receiving a respective second block-address signal, and said pull-down NMOS transistor having a source terminal connected to a reference potential; and wherein said row-driving unit further comprising a pull-up NMOS transistor having a gate terminal receiving the respective first block-address signal, and having drain and source terminals connected to the respective drain and source terminals of said pull-up PMOS transistor.

4. The circuit according to claim 3, wherein said first driver is supplied by the second supply voltage during reading operations and during programming operations.

5. The circuit according to claim 4, wherein said first driver comprises:
- an AND logic unit configured to receive at an input a first set of the high-voltage decoded address signals and to provide at an output the first block-address signals; and
- a first inverter unit configured to receive the first block-address signals and supply the negated version of the first block-address signals.

6. The circuit according to claim 3, wherein said second driver comprises:
- an input block configured to be supplied by the second supply voltage and configured to provide control signals; and
- an output block configured to be supplied by the biasing signal having alternatively a value of the first supply voltage and a value of a programming voltage based upon a programming operation and between the first supply voltage and the second supply voltage.

7. The circuit according to claim 6, wherein said input block comprises:
- an AND logic unit configured to receive at an input a second set of the high-voltage decoded address signals and to provide at an output the control signals; and
- a second inverter unit configured to receive the control signals and supply a negated version of the control signals.

8. The circuit according to claim 6, wherein the output block of said second driver comprises:
- a respective first pull-up PMOS transistor and a respective pull-down NMOS transistor each having a gate terminal connected together and configured to receive at an input a negated version of a respective one of the control signals and each having a drain terminal connected together and configured to provide a respective second block-address signal, said respective first pull-up PMOS transistor having a source terminal configured to receive the biasing signal, and said respective first pull-down NMOS transistor having a source terminal connected to a reference potential; and
- a respective pull-up NMOS transistor having a gate terminal configured to receive the respective one of the control signals and having drain and source terminals connected to the respective drain and source terminals of the respective pull-up PMOS transistor.

9. The circuit according to claim 1, wherein said memory cells are arranged in sectors, each sector comprising a plurality of sector wordlines; wherein said at least one row decoder stage comprises a plurality thereof associated with each of said sectors and configured to bias respective ones of said plurality of sector wordlines; and wherein the high-voltage decoded address signals and the biasing signal are common for said plurality of row decoder stages of the sectors.

10. The circuit according to claim 9, wherein said global predecoding stage comprises:
- a predecoding unit configured to operate in a range of the first supply voltage and generate, based upon the address signals, low-voltage decoded address signals; and
- a level-shifter unit configured to receive second supply voltage and the low-voltage decoded address signals and to generate, by up level shifting, the high-voltage decoded address signals;
- the high-voltage decoded address signals being common for said plurality of row decoder stages.

11. A memory device configured to receive a first supply voltage and a second supply voltage higher than the first supply voltage, the memory device comprising:
- a plurality of phase change memory cells arranged in a plurality of wordlines; and
- a row decoder circuit comprising
  - a global predecoding stage configured to
    - receive address signals, and
    - generate high-voltage decoded address signals in a range of the second supply voltage and a biasing signal with a value based upon an operation to be carried out, and
  - at least one row decoder stage coupled to the global predecoding stage and comprising
    - a selection driving unit configured to generate block-address signals based upon the high-voltage decoded address signals, and
    - a row-driving unit configured to generate a row-driving signal for biasing at least one of the plurality of wordlines based upon the block-address signals and the biasing signal.

12. The memory device according to claim 11, wherein said global predecoding stage comprises a multiplexer having a first input configured to receive the first supply voltage, a second input configured to receive a programming voltage having a value based upon a programming operation and between the first supply voltage and the second supply voltage, and an output configured to alternatively supply the first supply voltage and the programming voltage as the biasing signal based upon a control signal.

13. The memory device according to claim 11, wherein said selection driving unit comprises a first driver configured to generate first block-address signals and a second driver configured to generate second block-address signals; wherein said row-driving unit comprises a first pull-up PMOS transistor and a pull-down NMOS transistor each having a gate terminal connected together and configured to receive at an input a negated version of a respective first block-address signal that is negated, and each having a drain terminal connected together and supplying a respective row-driving signal, said pull-up PMOS transistor having a source terminal receiving a respective second block-address signal, and said pull-down NMOS transistor having a source terminal connected to a reference potential; and wherein said row-driving unit further comprising a pull-up NMOS transistor having a gate terminal receiving the respective first block-address signal, and having drain and source terminals connected to the respective drain and source terminals of said pull-up PMOS transistor.

14. The memory device according to claim 13, wherein said first driver is supplied by the second supply voltage during reading operations and during programming operations.

15. The memory device according to claim 14, wherein said first driver comprises:
- an AND logic unit configured to receive at an input a first set of the high-voltage decoded address signals and to provide at an output the first block-address signals; and
- a first inverter unit configured to receive the first block-address signals and supply the negated version of the first block-address signals.

16. The memory device according to claim 13, wherein said second driver comprises:
- an input block configured to be supplied by the second supply voltage and configured to provide control signals; and
- an output block configured to be supplied by the biasing signal having alternatively a value of the first supply voltage and a value of a programming voltage based upon a programming operation and between the first supply voltage and the second supply voltage.

17. The memory device according to claim 16, wherein said input block comprises:
an AND logic unit configured to receive at an input a second set of the high-voltage decoded address signals and to provide at an output the control signals; and
a second inverter unit configured to receive the control signals and supply a negated version of the control signals.

18. The memory device according to claim 16, wherein the output block of said second driver comprises:
a respective first pull-up PMOS transistor and a respective pull-down NMOS transistor each having a gate terminal connected together and configured to receive at an input a negated version of a respective one of the control signals and each having a drain terminal connected together and configured to provide a respective second block-address signal, said respective first pull-up PMOS transistor having a source terminal configured to receive the biasing signal, and said respective first pull-down NMOS transistor having a source terminal connected to a reference potential; and
a respective pull-up NMOS transistor having a gate terminal configured to receive the respective one of the control signals and having drain and source terminals connected to the respective drain and source terminals of the respective pull-up PMOS transistor.

19. The memory device according to claim 11, wherein said memory cells are arranged in sectors, each sector comprising a plurality of sector wordlines; wherein said at least one row decoder stage comprises a plurality thereof associated with each of said sectors and configured to bias respective ones of said plurality of sector wordlines; and wherein the high-voltage decoded address signals and the biasing signal are common for said plurality of row decoder stages of the sectors.

20. The memory device according to claim 19, wherein said global predecoding stage comprises:
a predecoding unit configured to operate in a range of the first supply voltage and generate, based upon the address signals, low-voltage decoded address signals; and
a level-shifter unit configured to receive second supply voltage and the low-voltage decoded address signals and to generate, by up level shifting, the high-voltage decoded address signals;
the high-voltage decoded address signals being common for said plurality of row decoder stages.

21. A method of using a row decoder circuit for a phase change non-volatile memory device comprising a plurality of memory cells arranged in a plurality of wordlines, the phase change non-volatile memory device configured to receive a first supply voltage and a second supply voltage higher than the first supply voltage, the method comprising:
using a global predecoding stage to
receive address signals, and
generate high-voltage decoded address signals in a range of the second supply voltage and a biasing signal with a value based upon an operation to be carried out; and using at least one row decoder stage coupled to the global predecoding stage and comprising
using a selection driving unit to generate block-address signals based upon the high-voltage decoded address signals, and
using a row-driving unit to generate a row-driving signal for biasing at least one of the plurality of wordlines based upon the block-address signals and the biasing signal.

22. The method according to claim 21, wherein the global predecoding stage comprises a multiplexer having a first input receiving the first supply voltage, a second input receiving a programming voltage having a value based upon a programming operation and between the first supply voltage and the second supply voltage, and an output alternatively supplying the first supply voltage and the programming voltage as the biasing signal based upon a control signal.

23. The method according to claim 21, wherein using the selection driving unit comprises using a first driver to generate first block-address signals and using a second driver to generate second block-address signals; wherein the row-driving unit comprises a first pull-up PMOS transistor and a pull-down NMOS transistor each having a gate terminal connected together and configured to receive at an input a negated version of a respective first block-address signal that is negated, and each having a drain terminal connected together and supplying a respective row-driving signal, the pull-up PMOS transistor having a source terminal receiving a respective second block-address signal, and the pull-down NMOS transistor having a source terminal connected to a reference potential; and wherein the row-driving unit further comprises a pull-up NMOS transistor having a gate terminal receiving the respective first block-address signal, and having drain and source terminals connected to the respective drain and source terminals of the pull-up PMOS transistor.

24. The method according to claim 23, wherein the first driver is supplied by the second supply voltage during reading operations and during programming operations.

25. The method according to claim 24, wherein using the first driver comprises:
using an AND logic unit to receive at an input a first set of the high-voltage decoded address signals and provide at an output the first block-address signals; and
using a first inverter unit to receive the first block-address signals and supply the negated version of the first block-address signals.

26. The method according to claim 23, wherein using the second driver comprises:
using an input block to be supplied by the second supply voltage and to provide control signals; and
using an output block to be supplied by the biasing signal having alternatively a value of the first supply voltage and a value of a programming voltage based upon a programming operation and between the first supply voltage and the second supply voltage.

\* \* \* \* \*